United States Patent [19]

Lane et al.

[11] 3,968,018

[45] July 6, 1976

[54] SPUTTER COATING METHOD

[75] Inventors: George C. Lane, Danbury; Cyril A. Cartwright, Monroe; Keith W. Elmslie, Guilford, all of Conn.

[73] Assignee: Warner-Lambert Company, Morris Plains, N.J.

[22] Filed: July 25, 1974

[21] Appl. No.: 491,717

Related U.S. Application Data

[63] Continuation of Ser. No. 861,937, Sept. 29, 1969, abandoned.

[52] U.S. Cl.............................. 204/192; 204/298
[51] Int. Cl.²...................................... C23C 15/00
[58] Field of Search........................... 204/192, 298

[56] References Cited
UNITED STATES PATENTS

| | | | |
|---|---|---|---|
| 3,294,670 | 12/1966 | Charschan et al. | 204/192 |
| 3,314,873 | 4/1967 | Lunsford | 204/298 |
| 3,340,176 | 9/1967 | Belluso et al. | 204/298 |
| 3,480,483 | 11/1969 | Wilkinson et al. | 204/192 |
| 3,525,680 | 8/1970 | Davidse et al. | 204/192 |

*Primary Examiner*—Oscar R. Vertiz
*Assistant Examiner*—Wayne A. Langel
*Attorney, Agent, or Firm*—Albert H. Graddis; Frank S. Chow

[57] ABSTRACT

An apparatus and method for sequentially cleaning and coating articles. The apparatus is in the form of a multi-chamber device, with each chamber being partially defined by valve units which permit passage of articles to be coated therethrough. Each chamber has associated therewith means for drawing a vacuum therein, several chambers include means for leaking a minute quantity of an inert but ionizable gas therein, and at least one chamber further includes at least one electrode, which may be placed in electrical communication with the articles so as to establish, in one of several ways, a direct current bias on the article with respect to another point within the chamber. Coating material to be transferred to the article is placed on one electrode, preferably in the form of a flat plate, in those chambers in which coating is to take place, whereas target material is not present in the cleaning or other non-coating chambers. One chamber is provided to serve as an air lock so that articles may be removed from it into the air while the chamber is sealed off from an adjacent chamber so as to prevent atmospheric contamination of coating material or articles to be coated in a coating chamber.

Means are provided for moving articles successively from one chamber to another so that the articles may be introduced into one chamber, cleaned, coated by passage into one or more succeeding chambers, and then removed through a last, vacuum or air lock chamber. Cleaning occurs by reverse sputtering, sputter etching, or glow discharge, and coating occurs by diode sputtering of a target material from a target electrode onto the substrate or article to be coated.

12 Claims, 1 Drawing Figure

U.S. Patent July 6, 1976 3,968,018
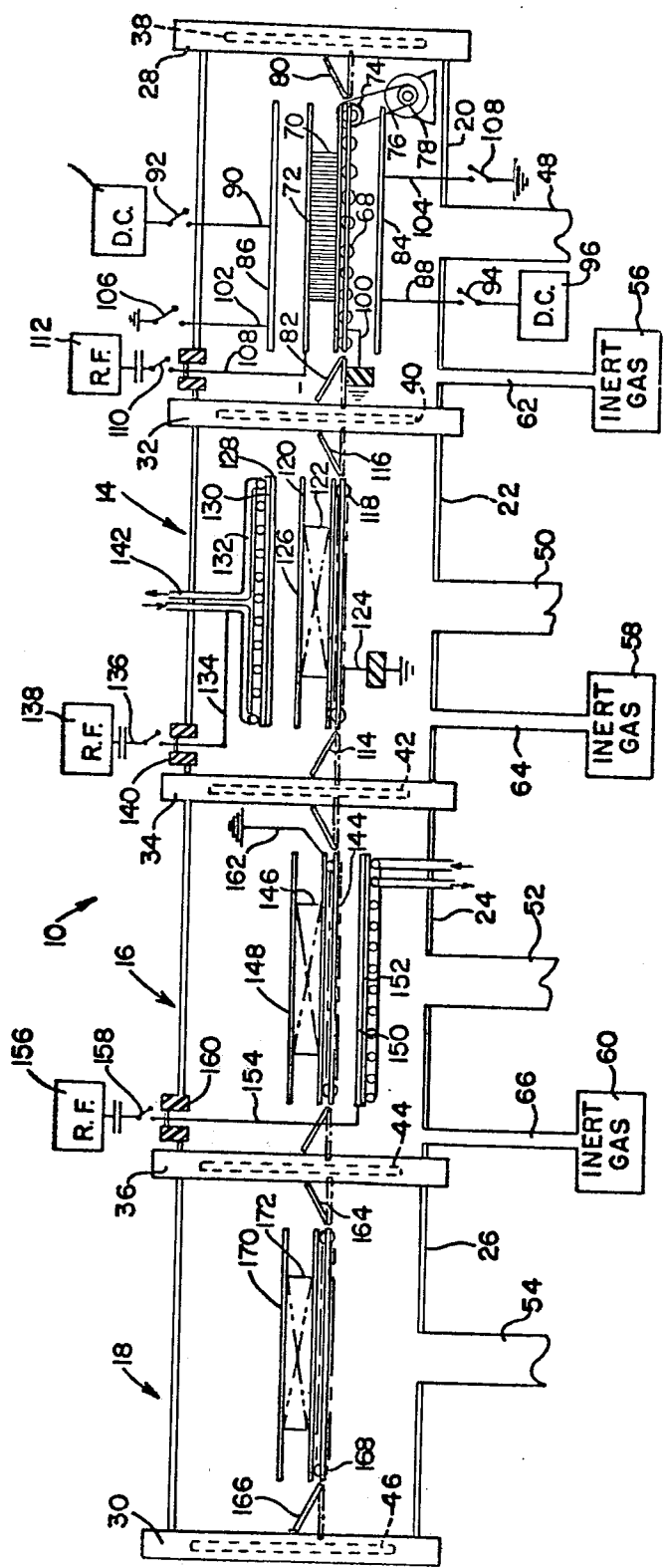

SPUTTER COATING METHOD

This is a continuation of application Ser. No. 861,937, filed Sept. 29, 1969, now abandoned.

BACKGROUND OF THE INVENTION

The present invention relates generally to coating apparatus and methods, and more particularly, to an apparatus and method for cleaning the surface of an article while the article is in a region of extreme high vacuum, transferring the article to a second high vacuum region, where a part or all of the article may be coated by cathodic sputtering, moving the article to an adjoining, evacuated chamber for coating at least a part of the remainder of the article, or for adding a second coating to the coating first placed on the article, and removal of the article into a vacuum lock chamber which is provided to prevent atmospheric contamination of the articles or of portions of the coating and cleaning chambers.

The use of cathodic radio frequency induced sputtering using one or two target plates and an electrically biased article as the substrate, and other similar coating methods generally referred to as sputtering methods, have recently been of increasingly great interest to many industries. The reason for the interest taken in such apparatus and methods is that these techniques provide, for the first time on a commercial scale, methods of placing extremely fine, strongly adherent, very uniform coatings in extremely thin layers or films.

For example, it has recently become possible to coat the edge of cutting instruments with desired coating materials, such as refractory metals and alloys, corrosion resisting metals and alloys, plastic coatings for lubrication or other purposes, and the like. Use of sputtering methods to achieve coatings such as these is highly advantageous since the coatings are so thin that it is possible to coat the cutting edge of an instrument after it has been finish ground and honed without perceptibly decreasing the sharpness thereof. Continuous coatings, that is, coatings totally free of voids, "pock marks", inclusions or other discontinuities, may be applied in thicknesses of from 1,000 Angstoms down to as little as 50 Angstroms or less, and typically fall in the range of about 100 Angstroms in the case of coating of metals such as chromium and the like. Coatings of this order of magnitude, that is, of only about 1/100th of a micron, add some mechanical strength to the cutting edge of the instrument, and greatly increase corrosion resistance. Cutting edges such as these can then be post-treated with a lubricating material such as tetrafluoroethylene polymer waxes or other lubricous organic coatings.

As an example, razor blades having a pure chromium metal coating overlying their cutting edges have demonstrated noticeably greater useful life than corresponding uncoated edges. As pointed out above, these coatings are extremely thin, and accordingly, the cost of material used to place these coatings on blades is not great. However, as is the case with many coatings of such a thin cross section, uniformity and adhesion are of great importance. Sputtering systems by their very nature tend to produce a very even, continuous film; however, in the event that the substrate or surface of the article to be coated is chemically contaminated or has otherwise undergone significant alteration in texture or makeup after being prepared for application of the sputtered coating, the bond between the sputtered coating material and the article surface or substrate may lack the requisite strength and continuity.

Since, as pointed out above, sharpening cutting edges involves the use of honing the edge with fine grinding wheels and strops, there is significant opportunity for surface contamination, such as inclusion of foreign matter, to occur. In addition, abrasive particles, oils or other lubricants, as well as oxidation from exposure to the atmosphere may also occur on a finish ground or honed blade edge. Besides the sources of contamination referred to above, other airborne contaminants may contact the blade edge after sharpening.

Accordingly, particularly in view of the short time required for oxidation of freshly cut metal edges in the presence of atmospheric oxygen, it is highly desirable to protect cutting edges from the time they are formed until a relatively impervious coating can be applied thereto.

Thus, an apparatus and methods capable of cleaning a previously sharpened edge, and maintaining it in a substantially perfectly clean condition until coating it in the same apparatus would represent a worthwhile advance in the coating art, particularly in the area of quality control and product reliability and uniformity.

Accordingly, an object of the present invention is to provide an improved coating apparatus for cleaning and coating various articles.

A further object is to provide a method of cleaning an article and coating it before it has had an opportunity to become contaminated after being cleaned.

A still further object is to provide an apparatus in which a plurality of articles may be treated at successive treatement stations by cleaning and coating under high vacuum conditions.

Another object is to provide a method of vacuum cleaning and coating an article, by the utilization of high vacuum techniques including glow discharge, reverse sputtering, or sputter etching followed by sputter coating of an article to be coated, all without exposure of the article to the atmosphere intermediate the cleaning and coating steps.

Another object is to provide an apparatus having a plurality of chambers, at least one for cleaning, one for coating and one for serving as a vacuum lock so that articles may be transferred successively from one chamber to another without being contaminated during cleaning and coating.

A still further object is to provide an apparatus having a plurality of chambers, at least one for cleaning and one for coating, in which each chamber has separate means associated therewith for evacuating such chamber and in which several of the chambers have associated therewith means for leaking inert gas into a region across which a high frequency alternating potential or a direct current potential exists within the chambers.

Another object is to provide an apparatus having a plurality of adjacent chambers, at least one for cleaning and one or more for coating, in which the chambers are connected by gate or valve mechanisms allowing each chamber to be isolated from the other in one operational mode, and allowing spatial communication between at least two of the chambers in another operational mode.

Another object is to provide an apparatus as set forth above which is useful in cleaning and coating by different but related methods, and which can be made to perform a variety of different operations merely by alteration of the external vacuum and electrical circuitry associated therewith.

A still further object is to provide a cleaning and coating apparatus making possible higher volume production of cleaned and coated articles.

Another object is to provide a method of cleaning and coating an article which includes a glow discharge, sputter etching, or reverse sputtering cleaning step in one chamber, movement of the article through a valve to a second chamber which is then isolated from the first chamber and wherein at least a part of a coating is applied to the article, and subsequent removal of the coated article from the coating chamber through a vacuum lock for isolating the coating chamber from the atmosphere.

The present invention achieves these and other of its objects by providing a multi-chamber apparatus including valve means for isolating one chamber from another, means for permitting movement of articles between chambers, means for establishing a vacuum in each chamber and means for establishing an electrical connection between an outside power source and one or more electrodes within certain of the chambers; and by providing a method which includes placing articles in a first chamber, evacuating the chamber, cleaning the articles by glow discharge, reverse sputtering or sputter etching, moving the articles successively to one or more adjacent chambers for coating without exposing the articles to the atmosphere intermediate the cleaning and one or more of the coating steps, and removing the coated articles through a vacuum lock. The exact manner in which the invention achieves these objects will become more clear when reference is made to the following detailed description, to the appended claims, and to the accompanying drawings, in which like reference numerals indicate corresponding parts throughout.

BRIEF DESCRIPTION OF THE DRAWING

The drawing is a side elevational view, partly in section, showing one form of the apparatus of the present invention and illustrating the practice of the method of the invention.

DESCRIPTION OF THE PREFERRED EMBODIMENTS OF THE INVENTION

Although it will be understood that the present invention is useful in a number of ways, description thereof will be made with reference to an embodiment in which cleaning and coating of only the edge portions of a large plurality of small articles takes place, such as treating an array of razor blades which have the edge portions thereof completely finish ground and honed before undergoing cleaning and coating treatment.

Referring now in greater detail to the drawing, the cleaning and coating apparatus 10 of the invention is shown to include a cleaning chamber 12, an adjacently disposed first coating chamber 14, a second coating chamber 16 disposed adjacent the first coating chamber 14, and a vacuum lock or article removal chamber 18. A portion of each of the chambers 12, 14, 18 is defined respectively by a plurality of air tight, cylindrical or other continuously extending side walls 20, 22, 24, 26, which may be circular in vertical cross section for adequate strength with minimum thickness.

The end chambers 12, 18 each include respective end wall portions 28, 30, while intermediate walls 32, 34, 36, respectively, form dividers between adjacent pairs of chambers 12 and 14, 14 and 16, and 16 and 18, respectively. Movable valve elements schematically illustrated at 38, 40, 42, 44, 46 are associated with each of the respective walls 28, 30, 32, 34, 36. In use, these valves or valve elements establish spatial communication between a region lying outside each of the chambers partially defined by the walls and the region within the chambers when the valves are opened, and serve to isolate the chambers from one another and from the atmosphere when the valves 38, 40, 42, 44, 46 are closed. Conduits 48, 50, 52, 54 are provided for establishing spatial communication with the interior of each of the chambers 12, 14, 16, 18, respectively and vacuum sources (not shown), so that a vacuum may be established and maintained in each of the chambers.

In the embodiment shown, three inert gas sources 56, 58, 60 are provided, each having an associated inert gas conduit 62, 64, 66 communicating with the interior of the respective chambers 12, 14, 16.

Thus, it will be seen that all of the chambers include means for establishing vacuum therein, and certain of the chambers further include means for permitting the entry of inert gas. Each chamber also includes valve means in the form of the movable valve elements 38, 40, 42, 44, 46 so that articles may be successively mounted from one chamber to another, and thus, after being introduced at one end of the apparatus 10, and moved successively from chamber to chamber, may also be removed from the opposite end thereof.

Referring now in more detail to the chamber 12, there is shown supporting means in the form of a plurality of rollers 68 for retaining and positioning a plurality of articles 70 contained within a fixture or holder 72 adapted to be moved axially of the apparatus upon rotation of a drive element 74 which is motor driven and connected by a chain or belt 76 to a motor 78. Ramps 80, 82 are adapted, in the phantom line position thereof shown in FIG. 1, to permit entrance of the holder 72 thereon and, in the raised or solid line position thereof to permit further movement of the holder 72 over the rollers 68. A pair of oppositely disposed cleaning electrodes in the form of plates 84, 86, each including a conductor 88, 90 may be placed in electrical communication through switches 92, 94 with one or more associated DC sources 96, 98. A lead 100 is adapted to allow connection to be made between ground potential and the holder 72, and consequently the articles 70 received in the holder 72 may be held at ground potential, if desired.

In addition, a pair of leads 102, 104 are provided, one for grounding each plate 84, 86 upon closing of an associated switch 106, 108, as will be described further herein. Means in the form of a lead 109 is provided for connecting the holder 72 and the articles 70 held thereon through a switch 110 to a radio frequency source 112, for impressing a radio frequency alternating potential on the holder 72 and any articles 70 received thereon.

Referring now to chamber 14, ramps 114, 116 are provided as are rollers 118 for receiving another holder 120 for another array of articles 122, the holder 120 containing, in the operation of the process, a previously inserted group of articles 122. A line 124 is provided to serve as a ground for the holder and articles 120, 122. Disposed in an oppositely facing relation to the upper margins or edge surfaces 126 of the articles 122 is a target plate 128 overlying and being in direct electrical connection with an electrode plate 130, which includes cooling means in the form of a plurality of tubes 132 attached thereto for the passage of a coolant such as water therethrough. A radio frequency alternating electrical potential is supplied to the electrode 130 and to the target 128 associated therewith, through the line 134 which is connected through switch 136 and a coupling capacitor 139 to a radio frequency source 138. A suitable insulator assembly 140 is provided for isolating the high energy emanating from the RF source from the chamber, while the ends 142 of the tubes 132 extend outside the chamber 14 and are adapted for connection to a cooling fluid source such as a water tap (not shown).

The chamber 16 is similar to chamber 14 except that an opposite margin or edge 144 of the articles 146 in a holder 148 is disposed opposite a target 150, which is attached to the electrode plate 152. Energy is supplied to the electrode plate 152 through a line 154 connected to another radio frequency source 156 through a coupling capacitor 157 and a switch 158, by a line 154 passing through an insulator assembly 160. Means in the form of a connector 162 are provided for grounding the articles 146 held in the frame 148.

The chamber 18 also includes a pair of ramps, shown at 164, 166, and rollers shown at 168 for supporting a holder 170 which includes the articles 172, but the chamber 18 includes only the vacuum conduit 54 for communication with a vacuum source, and does not include an inert gas source or any electrical connections. The valve or air lock formed by the movable valve element 46 allows the articles 172 disposed within the holder 170 to be removed from an axial end portion of the chamber 18, ordinarily when the valve element 44 is in the closed position.

As pointed out above, and is apparent from the claims, the present invention is capable of use in a number of operational modes, and therefore, a description will first be given as to the operation of the unit in one preferred mode thereof.

EXAMPLE 1

In a typical use of the apparatus 10 of the invention, a plurality of articles 70 such as razor blades or the like are disposed on a carrier 72 which is moved into position on the supporting rollers 68 after having traversed the ramp 80 through which entry to the interior of the chamber 12 was made when the valve element 38 was opened. With the holder 72 in position, the valve 38 is closed, and one or more vacuum pumps (not shown), such as mechanical roughing pump and an oil diffusion pump in series, or a so-called turbomolecular pump is operated so as to extract air through the conduit 48 from the interior of the chamber 12, until an absolute pressure of about $1 \times 10^{-6}$ millimeters (mm.) of mercury (Torr) results. This pressure is referred to herein, and in the vacuum coating art, as a background pressure, and represents the degree of vacuum or pressure present in the chamber in the absence of intentionally added gaseous material, as will be described more fully herein.

Next, a potential from about 500 to about 3000 volts DC, and preferably about 1000 volts, is impressed on the plates 84, 86 by operating the switches 92, 94, thereby connecting lines 88, 90 to a suitable direct current source 112. Thereupon, an inert gas such as argon is leaked through the conduit 62 from the source 56, until a total gas pressure of about $1 \times 10^{-2}$ to $1 \times 10^{-3}$ Torr is reached. Under these conditions, a current of about 500 milliamperes (ma) will be developed, and the resulting glow discharge will cause ionization of the argon atoms and, because of the DC bias or relative potential difference between the plates 84, 86 and the blades 70, ionized argon atoms will be drawn to the blade edges. Impingement of the atoms onto the edges of the articles or blades 70 will remove surface contaminants, particularly organic material, such as oils or greases and adsorbed gases. This operation may be carried out at ambient temperature, or, in the alternative, heater units (not shown) may be provided to accelerate the desorption of volatile materials. After a cleaning period of a suitable length, such as for example, 3 to 6 minutes, the valve controlling the supply of argon into the chamber 12 is turned off and the pressure is allowed to fall to or near the previous background level, namely $1 \times 10^{-6}$ Torr. The connections between the DC source 112 and the plates 84, 86 are then broken, by opening the switches 92, 94.

During this cleaning time or therebefore, but in any event, before opening the valve element 40, the chamber 14 is evacuated to the $1 \times 10^{-6}$ Torr background pressure by means of a pump (not shown) drawing gases through conduit 50. At this point, with the valve element 42 closed, valve element 40 is opened, and as the ramps 82, 116 fall into position with their adjacent ends abutting, the fixture 72 is moved into the chamber 14. Since a continuous process is illustrated, however, the drawing shows that a preceding fixture 120 of a series of fixtures or holders 120, 148, 170 is positioned within the chamber 14, it being understood that fixture 72, in the operation of the process, would next occupy chamber 14. After the holder 120 is in the desired position on the rollers 118, argon gas is leaked through the conduit 64 from the source 58 until a pressure of approximately 6 to $9 \times 10^{-4}$ Torr is reached. At this level, a radio frequency alternating current is supplied to the electrode plate 130 and to the associated target plate 128 upon closing of the switch 136, which controls current flow through the line 134 passing from the RF source 138 through the insulator 140 to the tubes 132. These tubes 132 are in physical and electrical contact with the plates 128, 130. In a typical embodiment, a 13.56 megahertz (mhz) radio frequency is used, this frequency being supplied by a crystal controlled oscillator and an amplifier of any well known type. A line 124 insures that the holder 120 and the articles 122 contained theron are at ground potential. As the radio frequency alternating voltage is applied to the plates 128, 130, to which it is capacitively coupled by capacitor 139, a large DC bias is built up on the plate 128, and consequently, atoms of argon struck by the high frequency electrons within the alternating voltage field are attracted to the target plate 128 with great force, thereupon striking the plate 128 and sputtering surface atoms therefrom. The sputtered atoms are deposited on the exposed edges lying along the upper surface 126 of the array of blades or other articles 122. Typically, the coating material used is a pure metallic chromium which has been electrolytically deposited on the plate 128. According to known practice, the plate 128 is removably associated with the electrode plate 130 so that the coating on the target may be renewed periodically as it is depleted.

Only the capacitor 139 proper has been shown as a means of coupling the RF source 138 to the plates 128, 130, since the drawing is somewhat schematic, but it will be understood that the actual coupling may take place by means of a so-called pi matching network or matching box which tunes a group of inductors and capacitors so that the total impedance of the target portion of the circuit matches the output impedance of the oscillator and amplifier or output circuit. Thus, typically, the effective impedance of the target plate circuit might be about 50 ohms at the selected frequency, although of course the target circuit, being basically a circuit without positive connections at either end, has practically infinite DC resistance.

Coating of the blade edges typically takes place over a period of two to five minutes, following which the switch 136 is opened and the supply of inert gas is shut off, allowing the chamber 14 again to reach its background pressure of $1 \times 10^{-6}$ Torr.

Assuming that the chamber 16 has been evacuated to the same background level at or before this time, the gate or valve element 42 may be opened to place the chambers 14, 16 in spatial communication with each other, following which the holder 120 is moved into position within the chamber 16.

However, since the operation is assumed to be continuous, the drawing shows still another holder 148 having a supply of articles such as blades 146 thereon already in position with the second coating chamber 16. The basic function of the second coating chamber 16 is identical to that of chamber 14, and structurally, the only difference is that the target 150 and its associated electrode plate 152 are on the opposite side of the article 146. Thus, assuming that double edge razor blades are the articles 146 to be coated, the chamber 16 provides means for coating the edges thereof which are disposed opposite the edges coated in the chamber 14.

With the ground line 162 serving to keep the articles at a grounded potential, the same sequence of operations is performed in chamber 16 as was performed in chamber 14, including addition of inert gas to the same pressure, closing the switch 158, and, while supplying RF current to the electrode plate 152 and its associated target plate 150, allowing the capacitatively coupled plate 150 to become self-biased, whereupon coating of the edges of the article by cathodic sputtering takes place in the manner set forth above.

Referring again to the drawing, it is also shown that still another holder 170 having articles 172 therein is positioned by rollers 168 within the vacuum or air lock chamber 18. The conduit 54 is likewise connected to a vacuum source, and prior to entry of articles into this chamber 18 from the adjacent chamber 16, a $1 \times 10^{-6}$ Torr vacuum is drawn thereon, so that, as the articles are moved from the last coating chamber 16 to the air lock chamber 18, substantially no air can pass into the second coating chamber 16. Passage of air into the chamber 16 would not only present a problem of surface oxidation of the articles previously cleaned and being coated, but would also present a problem of contaminating the surface of the target 150, with the consequent risk that the coating material sputtered from this surface would not be a pure material, but would be contaminated or oxidized, even if only in part. After the valve element 44 is closed, the holder 170 bearing the articles 172 may be removed through the valve 46 into the atmosphere. Thereupon, valve 46 is again closed and a vacuum is again drawn on the interior of chamber 18 prior to opening of the valve 44 for passage of another holder into the vacuum or air lock chamber 18. Removal of each successive holder takes place in the same manner.

Operation of the apparatus in this sequence thus provides a means for cleaning the articles, and for preventing any contamination of the articles or the targets 128, 150 until the articles are coated and are ready to be withdrawn from the apparatus.

This arrangement does away with the need for providing an intermittent operation wherein the surface of the target must be cleaned in a vacuum by a preliminary sputtering or like operation before the surface atoms of the target are allowed to be directed onto the intended substrate or article.

This embodiment of the invention has been described with respect to an operation in which the chromium coating is applied first to one edge of a double edge razor blade and then another edge. However, it will be understood that any number of coating chambers, such as the chambers 14, 16 might be provided in series. As an example, two additional, similar or identical chambers might be provided, differing in that each might have a target of an aluminum oxide ($Al_2O_3$) material, which would be adapted to be placed over the chromium. Likewise, an additional pair of chambers might be provided for placing a lubricous flurocarbon coating onto the edge, and likewise, in this case, the only difference would be the composition of the surface on the targets.

EXAMPLE 2

Referring again to the drawing, an operation will be described which is identical to the above described operation set forth in Example 1, except that the mechanics of the cleaning step are somewhat different.

Once the articles 70 held in the fixture or holder 72 are in place within the chamber 12, and the appropriate background pressure has been established, argon is leaked into the chamber 12 until a pressure of from about 1 to about $3 \times 10^{-3}$ Torr is attained. Electrical connections are established between the articles 70 and the RF source 112 by closing the switch 110. At this time, or before, the switches 106, 108 are closed so that the plates 84, 86 are grounded. The RF source, which may be 13.56 megacycle supply source, and which is coupled to the articles 70 through the capacitor 113, is regulated to a power setting of about 50 ma, causing a DC bias of up to about 3000 volts to be built up between the articles and the plates. The ionized argon atoms are attracted to the blade edges because of this charge, and the cleaning carried out according to this method is characterized as a reverse sputtering, that is, in this mode of operation, the article or substrate which will be coated in an adjoining chamber is used as the target in the cleaning chamber. The effect of using the edges as the target is to completely clean the edges, and to a certain extent, remove not only the contaminants from the surface but a portion of the surface itself. After cleaning, the argon leak valve is turned off, the background vacuum is restored to its previous level, and the reverse sputter cleaned articles are ready for subsequent coating in the same manner as described in connection with Example 1.

EXAMPLE 3

Cleaning of the articles may also be accomplished by a method characterized as sputter etching. This operation differs from the reverse sputtering operation just described only in that the power and vacuum settings and the physical disposition of the plates in respect to the articles may be somewhat different. For example, the background pressure is initially the same, but argon may be added until a pressure of about 6 to 9 × 10⁻¹ Torr is reached. The plates 84, 86 are preferably situated physically a greater distance apart from the article 70, and with approximately 100 watts of 13.56 mhz. power supplied to the articles, the DC bias thereon may reach about 4000 to 5000 volts. An operation of this sort, using somewhat less inert gas and higher voltages, is sometimes characterized as a sputter etching operation, and provides a very effective cleaning method, particularly for certain types of articles. Following cleaning by the sputter etching method just described, the valve controlling entry of the inert gas to the chamber 12 is turned off, and the electrical switches are opened so as to allow conditions within the chamber 12, including vacuum conditions, to return to their previous state. After cleaning as set forth above, the articles and holder are adapted to be moved to an adjoining chamber for coating operations carried out in the manner described in connection with Example 1, above.

As pointed out above, although in some cases, it is preferred to change the spacing between the electrodes or plates and the articles when different forms of cleaning are utilized, this is not strictly necessary, and accordingly, it is possible to provide a single apparatus which is useful in a number of operational modes and depends for this operation only on connection or external circuitry. Such an apparatus, by reason of the plural chambers and the functional relations therebetween, is adapted to permit high volume, low cost, high quality production free of many of the disadvantages of prior known production sputtering systems.

It will thus be seen, that the present invention provides an improved coating apparatus and method having a number of advantages and characteristics including those pointed out herein and others which are inherent in the invention.

We claim:

1. A method of batch cleaning and batch coating one array of articles with a thin coating material while maintaining said one array substantially free from contamination, said method comprising the steps of:
   a. disposing said one array within a first evacuable region;
   b. establishing a predetermined high vacuum in said first evacuable region;
   c. establishing a high electrical potential between said one array and an electrode;
   d. introducing a minute quantity of an ionizable inert gas into said first region and thus increasing the pressure therein whereby said one array will have at least portions of the surface thereof cleaned by bombardment with ions of said gas attracted to said surfaces;
   e. thereafter reestablishing said predetermined high vacuum in said first region;
   f. providing spacial communication between said first region and a second evacuable region having said predetermined high vacuum established therein;
   g. moving said one array at said predetermined high vacuum into said second region;
   h. then isolating said second region from said first region;
   i. establishing a high electrical potential between said one array and a target in said second region having a coating of material to be applied to said one array;
   j. introducing a controlled quantity of an inert gas into said second region whereby said inert gas increases the pressure therein and, when ionized in the presence of said high potential, causes transfer of said material from said target to said one array;
   k. thereafter reestablishing said predetermined high vacuum in said second region;
   l. providing spacial communication between said second region and a third evacuable region having said predetermined high vacuum established therein;
   m. moving said one array at said predetermined high vacuum to said third region; and
   n. isolating said third region from said second region.

2. The method of claim 1 further comprising the steps of:
   o. establishing a high electrical potential between said one array and another target in said third region having another coating of material to be applied to said one array;
   p. introducing a controlled quantity of an inert gas into said third region whereby said inert gas increases the pressure therein and, when ionized in the presence of said high potential, causes transfer of said material from said another target to said one array;
   q. thereafter reestablishing said predetermined high vacuum in said third region;
   r. providing spacial communication between said third region and a fourth evacuable region having said predetermined high vacuum established therein;
   s. moving said one array at said predetermined high vacuum to said fourth region; and
   t. isolating said fourth region from said third region.

3. The method of claim 2 further comprising the steps of:
   u. providing spacial communication between said fourth region and ambient atmosphere;
   v. removing said one array from said fourth region;
   w. isolating said fourth region from ambient atmosphere; and
   x. reestablishing said predetermined high vacuum in said fourth region.

4. The method of claim 1 wherein said articles are razor blades.

5. The method of claim 1 further comprising the steps of:
   o. providing spacial communication between said third region and ambient atmosphere;
   p. removing said one array from said third region;
   q. isolating said fourth region from ambient atmosphere; and
   r. reestablishing said predetermined high vacuum in said third region.

6. The method of claim 1 wherein steps (a) through (e) are repeated for another array of articles while steps (h) through (k) are being performed on said one array.

7. A method of batch cleaning and batch coating an array of articles with a thin coating material while maintaining said array substantially free from contamination, said method comprising the steps of disposing said array within a first evacuable region; establishing a predetermined high vacuum in said first evacuable region; establishing a high electrical potential between said array and a surrounding surface; introducing a minute quantity of an ionizable inert gas into said first region and thus increasing the pressure therein whereby said array will have at least portions of the surfaces thereof cleaned by bombardment with ions of said gas attracted to said surface; thereafter reestablishing said predetermined high vacuum in said first region; providing spacial communication between said first region and a second evacuable region having said predetermined high vacuum established therein; moving said array at said predetermined high vacuum into said second region; then isolating said second region from said first region; establishing a high electrical potential between said array and a target in said second region having a coating of material to be applied to said array; introducing a controlled quantity of an inert gas into said second region whereby said inert gas increases the pressure therein and, when ionized in the presence of said high potential, causes transfer of said material from said target to said array; thereafter reestablishing said predetermined high vacuum in said second region; providing spacial communication between said second region and a third evacuable region having said predetermined high vacuum established therein; moving said array at said predetermined high vacuum to said third region; and isolating said third region from said second region.

8. The method of claim 7 further comprising the steps of establishing a high electrical potential between said array and another target in said third region having another coating of material to be applied to said array; introducing a controlled quantity of an inert gas into said third region whereby said inert gas increases the pressure therein and, when ionized in the presence of said high potential, causes transfer of said material from said another target to said array; thereafter reestablishing said predetermined high vacuum in said third region; providing spacial communication between said third region and a fourth evacuable region having said predetermined high vacuum established therein; moving said array at said predetermined high vacuum to said fourth region; and isolating said fourth region from said third region.

9. The method of claim 8 further comprising the steps of providing spacial communication between said fourth region and ambient atmosphere; removing said array from said fourth region; isolating said fourth region from ambient atmosphere; and reestablishing said predetermined high vacuum in said fourth region.

10. The method of claim 7 wherein said articles are razor blades.

11. The method of claim 7 further comprising the steps of providing spacial communication between said third region and ambient atmosphere; removing said array from said third region; isolating said third region from ambient atmosphere; and reestablishing said predetermined high vacuum in said third region.

12. A method of cleaning and coating at least one article comprising, inserting said article into a cleaning chamber, evacuating said cleaning chamber, establishing a high electrical potential between said article and a reference point within said cleaning chamber, introducing a minute quantity of an inert gas into the region between said article and said reference point to clean said article by ionic surface bombardment, transferring said article directly from said cleaning chamber to an evacuated coating chamber while maintaining a high vacuum level in said cleaning chamber, isolating said cleaning chamber from said coating chamber into which said article is transferred, establishing an electrical potential between a target disposed within said coating chamber and said article, leaking small quantities of an inert gas into the region between the article and target to sputter surface material from the target to the article, re-evacuating said coating chambers, moving said article from said re-evacuated coating chamber to at least one adjacent evacuated coating chamber, and establishing and maintaining substantially the same vacuum level in each of said coating chambers while moving said article between said coating chambers when said coating chambers are in spatial communication with each other, and, after completion of the coating process, moving said article directly to a previously evacuated article removal chamber disposed adjacent said adjacent evacuated coating chamber to prevent communication between an outside atmosphere and said adjacent evacuated coating chamber, isolating said adjacent evacuated coating chamber from said removal chamber and removing said article from said removal chamber while said adjacent evacuated coating chamber is isolated therefrom.

* * * * *